United States Patent
Kim et al.

(10) Patent No.: US 8,183,689 B2
(45) Date of Patent: May 22, 2012

(54) PRINTED CIRCUIT BOARD AND FLIP CHIP PACKAGE USING THE SAME WITH IMPROVED BUMP JOINT RELIABILITY

(75) Inventors: Seong Cheol Kim, Gyeongsangnam-do (KR); Myung Geun Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 313 days.

(21) Appl. No.: 11/760,010

(22) Filed: Jun. 8, 2007

(65) Prior Publication Data

US 2008/0277783 A1 Nov. 13, 2008

(30) Foreign Application Priority Data

May 8, 2007 (KR) .................. 10-2007-0044435

(51) Int. Cl.
*H01L 23/48* (2006.01)
(52) U.S. Cl. ........ 257/737; 257/778; 257/784; 257/692; 257/E21.015
(58) Field of Classification Search .................. 257/687, 257/723, 735–738, 758, 774, 777–784, 692, 257/E21.015
See application file for complete search history.

(56) References Cited

U.S. PATENT DOCUMENTS

| 6,861,284 B2 * | 3/2005 | Higashi et al. ............... 438/107 |
| 2006/0022332 A1 * | 2/2006 | Koyama et al. ............... 257/723 |
| 2007/0111500 A1 * | 5/2007 | Cowens et al. ............... 438/612 |

FOREIGN PATENT DOCUMENTS

JP 2000-138313 5/2000
JP 2003-133372 5/2003

* cited by examiner

*Primary Examiner* — Ha Tran T Nguyen
*Assistant Examiner* — Suberr Chi
(74) *Attorney, Agent, or Firm* — Ladas & Parry LLP

(57) ABSTRACT

A printed circuit board and a flip chip package using the same are designed to minimize thermal stress due to different thermal coefficients present in areas having metal lines and solder resist versus other areas on the printed circuit board. The printed circuit board includes an insulation layer; a first metal line formed on one surface of the insulation layer and having at one end thereof a bump land and a projection which integrally extends from the bump land; a second metal line formed on the other surface of the insulation layer and having at one end thereof a ball land; a via metal line formed through the insulation layer to connect the first and second metal lines to each other; and solder resists formed on the upper and lower surfaces of the insulation layer to expose the bump land and the ball land.

5 Claims, 2 Drawing Sheets

PRINTED CIRCUIT BOARD AND FLIP CHIP PACKAGE USING THE SAME WITH IMPROVED BUMP JOINT RELIABILITY

CROSS-REFERENCE TO RELATED APPLICATION

The present application claims priority to Korean patent application number 10-2007-0044435 filed on May 8, 2007, which is incorporated herein by reference in its entirety.

BACKGROUND OF THE INVENTION

The present invention relates to a printed circuit board and a flip chip package using the same, and more particularly to a printed circuit board with improved reliability in the bump joints and a flip chip package using the same.

Recently, the electronic industry has adopted a mounting technique employing a printed circuit board, which enables the high-density and high-precision mounting of parts for the purpose of miniaturizing and decreasing the weight of electronic appliances. Specifically, with the development of technologies associated with chip size package (CSP), such as a ball grid array (BGA) package and a tape carrier package (TCP), a high-density printed circuit board capable of mounting an increased number of semiconductor chips has drawn considerable attention.

Accordingly, the manufacture of light-weight and compact electronic appliances requires fine-processing techniques as well as the printed circuit boards conducive to the high-density mounting of parts.

A printed circuit board is made by forming line patterns on an insulation layer using a conductive material, such as copper, and it is the substrate on which the electronic parts are mounted thereon. A printed circuit board has an insulation layer, metal lines formed on the upper and lower surfaces of the insulation layer, and via metal lines formed through the insulation layer to electrically connect the metal lines.

Printed circuit boards may be used in flip chip packages. In a flip chip package, securing high reliability of the bump joints electrically connecting the semiconductor chip and the printed circuit board is important.

However, during a fabrication process, the solder resist formed on the metal lines versus the solder resist formed on other areas of the printed circuit board but not on the metal lines creates difference in bulk such that these two regions on the printed circuit board would have different thermal expansion coefficients. The difference in the thermal expansion coefficient in theses portions on the printed circuit board causes the stress to increase in the boundaries of the metal line on the printed circuit board. Consequently, when manufacturing a flip chip package incorporating a conventional printed circuit board as discussed above, adverse influence is exerted on the bump joints that are connected to metal lines such that cracks may occur in the bump joints. This degrades the reliability of the flip chip package.

Also, the difference in thermal expansion coefficient induced by the difference in bulk between the portions of the solder resist on the printed circuit board formed on the metal lines versus not on the metal line also causes an increase in the overall stress on the printed circuit board, thereby causing warpage in the printed circuit board.

SUMMARY OF THE INVENTION

An embodiment of the present invention is directed to a printed circuit board, which prevents the occurrence of warpage due to the difference in thermal expansion coefficient between regions of the solder resist.

Another embodiment of the present invention is directed to a flip chip package which improves the reliability of a bump joint.

In one embodiment, a printed circuit board comprises an insulation layer; a first metal line formed on one surface of the insulation layer and having at one end thereof a bump land and a projection which integrally extends from the bump land; a second metal line formed on the other surface of the insulation layer and having at one end thereof a ball land; a via metal line formed through the insulation layer to connect the first and second metal lines to each other; and solder resists formed on one and the other surfaces of the insulation layer to expose the bump land and the ball land.

The first metal line, the second metal line and the via metal line are made of copper.

The projection of the first metal line extends toward an edge of the insulation layer.

The first metal line has at least one projection.

The projection of the first metal line extends from the bump land by a length of 5~100 μm.

In another embodiment, a flip chip package comprises a printed circuit board including an insulation layer, a first metal line formed on one surface of the insulation layer and having at one end thereof a bump land and a projection which integrally extends from the bump land, a second metal line formed on the other surface of the insulation layer and having at one end thereof a ball land, a via metal line formed through the insulation layer which connects the first and second metal lines to each other, and solder resists formed on one and the other surfaces of the insulation layer to expose the bump land and the ball land; a semiconductor chip bonded to one surface of the printed circuit board through face-down type bumps which electrically connect to the first metal line; a filler material filled between the printed circuit board and the semiconductor chip; a molding material for molding one surface of the printed circuit board including the semiconductor chip; and solder balls attached to ball lands of the printed circuit board.

The first metal line, the second metal line and the via metal line are made of copper.

The projection of the first metal line extends towards an edge of the insulation layer.

The first metal line has at least one projection.

The projection of the first metal line extends from the bump land by a length of 5~100 μm.

DESCRIPTION OF SPECIFIC EMBODIMENTS

In the present invention, a portion of the metal line to which a bump is to be attached is formed to have a bump land and a projection extending from the bump land by a predetermined length. In the present invention, when forming a metal line on the upper surface of a printed circuit board, a projection is formed to integrally extend from a bump land to a position outside the bump land.

In the present invention, since the metal land having a projection integrally extends from the bump land to a position adjacent to an edge of the printed circuit board and to where a metal line is not formed in the conventional art, around the bump land, minimizing the difference in thermal expansion coefficient, which is caused by a difference in bulk between the portion of the solder resist formed on the metal line and the remainder of the solder resist, which is not formed on the metal line.

Accordingly, in the present invention, by minimizing the difference between the thermal expansion coefficient caused by a difference in bulk between the portions of the solder resist around the bump land, it is possible to decrease the stress applied to the bump land. Therefore, when manufacturing a flip chip package incorporating the printed circuit board according to the present invention, it is possible to prevent cracks from occurring in the bump joint and the bonding pad of a semiconductor chip upon exposure to the outside, therefore improving the reliability of the bump joint.

Also, in the present invention, since the difference in the thermal expansion coefficient caused by a difference in bulk between the portions of the solder resist is minimized, the stress applied to the printed circuit board is decreased, thereby preventing warpage of the printed circuit board.

Figure 1A:
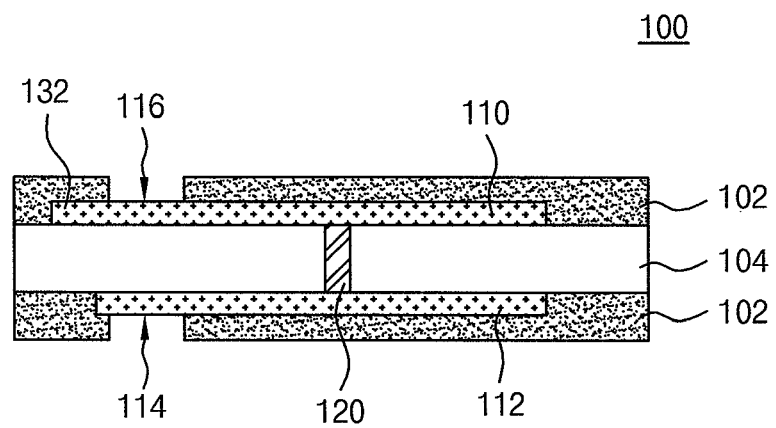
FIGS. 1A and 1B are a cross-sectional view and a plan view illustrating a printed circuit board in accordance with an embodiment of the present invention.
Figure 1B:
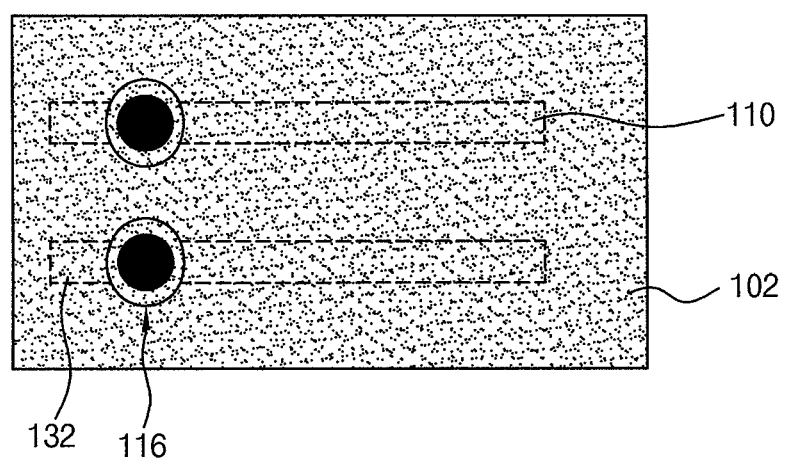

FIGS. 1A and 1B are a cross-sectional view and a plan view illustrating a printed circuit board in accordance with an embodiment of the present invention. Hereafter, the printed circuit board in accordance with an embodiment of the present invention will be described in detail with reference to FIGS. 1A and 1B.

Referring to FIGS. 1A and 1B, a printed circuit board 100 in accordance with an embodiment of the present invention includes an insulation layer 104. A first metal line 110 and a second metal line 112 are respectively formed on the upper and lower surfaces of the insulation layer 104. A via metal line 120 is formed through the insulation layer 104 to connect the first and second metal lines 110 and 112 to each other. Solder resists 102 are respectively applied to the upper and lower surfaces of the insulation layer 104 to cover the upper and lower surfaces excluding a bump land 116 on the first metal line 110 and a ball land 114 on the second metal line 112.

The first metal line 110 is formed on the upper surface of the insulation layer 104 and has on an end thereof the bump land 116 and a projection 132, which extends from the bump land 116. Preferably, the projection 132 is formed to extend toward an adjacent edge of the insulation layer 104. The projection 132 is formed to extend from the bump land 116 by a length of 5~100 μm. The first metal line 110 has at least one projection 132. The overall surface of the first metal line 110 excluding the bump land 116 is covered by the solder resist 102, which is applied to the upper surface of the insulation layer 104. It is preferred that the area for the bump land 116 of the first metal line 110 is defined in the shape of a circle or an ellipse.

The second metal line 112 is formed on the lower surface of the insulation layer 104, and has the ball land 114 on an end thereof. The overall surface of the second metal line 112 excluding the ball land 114 is covered by the solder resist 102, which is applied to the lower surface of the insulation layer 104.

The via metal line 120 is formed to electrically connect the first and second metal lines 110 and 112 to each other, which are respectively formed on the upper and lower surfaces of the insulation layer 104. Preferably, the via metal line 120 is made of copper.

While it was illustrated and explained in an embodiment of the present invention that the via metal line 120 is structured to directly connect the first and second metal lines 110 and 112 to each other, the via metal line 120 could also be formed in a multi-layered structure or like others.

In the printed circuit board 100 according to an embodiment of the present invention, a portion of the first metal line 110, to which a bump is to be attached, is formed to have the projection 132 extending from the bump land 116 by a predetermined length. That is to say, when forming the first metal line 110 on the upper surface of the printed circuit board 100, the projection 132 is additionally formed to integrally extend from the bump land 116 to a position which is outside the bump land 116 and where the first metal line 110 is not formed in the conventional art. Therefore, in the area of the bump land 116, it is possible to minimize the difference in thermal expansion coefficient caused by the difference in bulk between one portion of the solder resist 102 which is formed on the first metal line 110 and the other portion of the solder resist 102 which is not formed on the first metal line 110.

Accordingly, in an embodiment of the present invention, since it is possible to minimize the difference in thermal expansion coefficient between portions of the solder resist 102 in the area of the bump land 116, the stress applied to the bump land 116 is dissipated to the surrounding area of the bump land 116.

Figure 2:
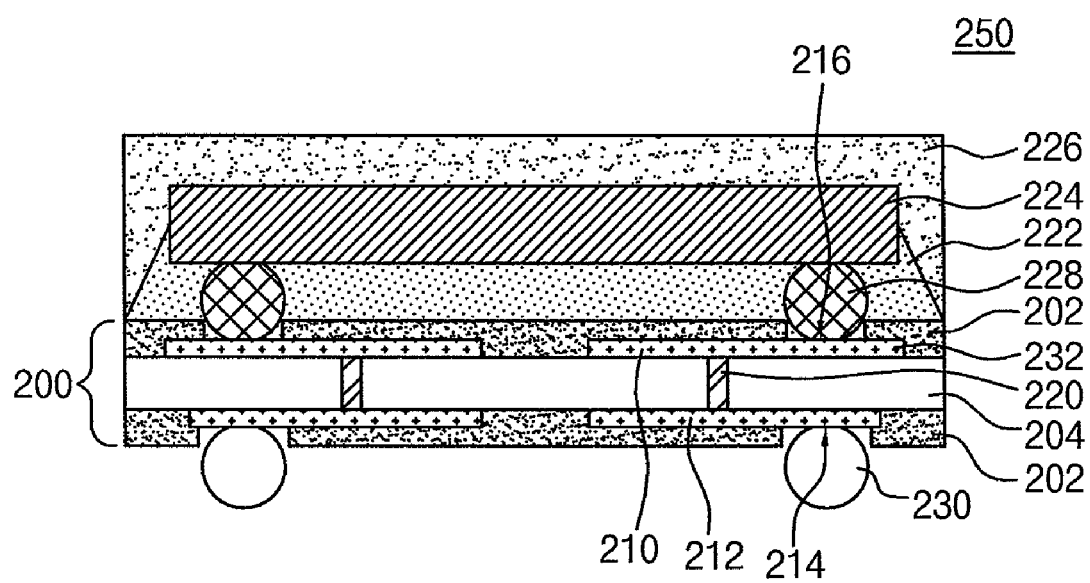
FIG. 2 is a cross-sectional view illustrating a flip chip package in accordance with another embodiment of the present invention, which is realized using the printed circuit board.

FIG. 2 is a cross-sectional view illustrating a flip chip package in accordance with an embodiment of the present invention, which is realized using the printed circuit board as described above.

Referring to FIG. 2, a flip chip package 250 in accordance with an embodiment of the present invention includes a printed circuit board 200, a semiconductor chip 224 which is attached to the printed circuit board 200 through the bumps 228, and solder balls 230 which are attached to respective ball lands 214 on the lower surface of the printed circuit board 200.

In the flip chip package 250 in accordance with an embodiment of the present embodiment, the space between the semiconductor chip 224 including the bumps 228 and the printed circuit board 200 is filled with an under-fill material 222, and the upper surface of the printed circuit board 200 including the semiconductor chip 224 is molded with a molding material 226 such as an epoxy molding compound, to protect the semiconductor chip 224 from external stress.

As discussed above, the printed circuit board 200 includes an insulation layer 204, a first metal line 210 formed on one surface of the insulation layer 204 and having a bump land 216 on an end thereof and a projection 332 which extends from the bump land 216, a second metal line 212 formed on the other surface of the insulation layer 204 and having a ball land on an end thereof, and a via metal line 220 formed through the insulation layer 204 to connect the first and second metal lines 210 and 212 to each other. Solder resists 202 are applied to one and the outer surfaces of the insulation layer 204 to expose the bump land 216 and the ball land 214.

The projection 332 of the first metal line 210 is formed to extend toward an adjacent edge of the insulation layer 204 by a length of 5~100 μm. The first metal line 210 has at least one projection 332. The projection 332 is covered by the solder resist 202 which is applied to the upper surface of the insulation layer 204.

The semiconductor chip 224 is attached to the upper surface of the printed circuit board 200 in a face-down manner and is electrically and physically connected to the printed circuit board 200 through the bumps 228.

As described above, in the present invention, since the flip chip package is realized using the warpage-resistant printed circuit board, stress concentration on the bump joint and resulting cracks and exposure of the bonding pad of the semiconductor chip are prevented. Therefore, in the flip chip package according to the present invention, the reliability of the bump joint is improved.

While the above embodiment was limitedly illustrated and explained in respect to a printed circuit board for a flip chip package, it can be envisaged that, even in a wafer level package, in order to improve the reliability of a solder ball joint, a printed circuit board can be formed such that a metal line is extended from a ball land toward an edge of the printed circuit board to have a projection to thereby achieve the same effects as those of the above embodiment.

As is apparent from the above description, in the present invention, due to the fact that an end of the metal line of a printed circuit board is formed to have a projection which extends from a bump land by a predetermined length, it is possible to decrease the stress applied to a bump joint due to a difference in thermal expansion coefficient between portions of a solder resist.

As a consequence, in the present invention, the occurrence of cracks in the bump joint and exposure of the bonding pad of a semiconductor chip can be prevented, whereby the reliability of the bump joint can be improved. Moreover, in the present invention, since the difference in thermal expansion coefficient caused by a difference in bulk between the portions of the solder resist is minimized, the stress applied to the printed circuit board is decreased and warpage of the printed circuit board is therefore prevented.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A printed circuit board comprising:
an insulation layer;
a first metal line formed on a first surface of the insulation layer, the first metal line comprising: a bump land at one end thereof; at least one projection which integrally extends from the bump land coplanar with the first metal line and along the first surface toward an edge of the insulation layer;
a second metal line formed on a second surface of the insulation layer opposite the first surface;
a via metal line electrically connecting the first and second metal lines; and
solder resist formed at least over the first surface of the insulation layer and on the first metal line to expose the bump land,
wherein the at least one projection has a length of 5 μm to 100 μm to minimize a difference in thermal expansion coefficient caused by a difference in bulk between one portion of the solder resist formed on the first metal line and another portion of the solder resist not formed on the first metal line.

2. The printed circuit board according to claim 1, wherein the first metal line, the second metal line, and the via metal line are made of copper.

3. The printed circuit board according to claim 1, wherein the at least one projection of the first metal line extends along the first surface toward the edge of the insulation layer further than the second metal line extends toward the same edge of the insulation layer, such that the first metal line is closer to the edge of the insulation layer than the second metal line.

4. The printed circuit board according to claim 1, wherein the first metal line has at least one projection.

5. The printed circuit board according to claim 1, wherein the solder resist is formed on the first surface of the insulation layer to expose the ball land.

* * * * *